United States Patent
Ulmer (10) Patent No.: US 10,262,978 B2
(45) Date of Patent: Apr. 16, 2019

(54) METHOD FOR FABRICATING AN EMISSIVE DISPLAY USING LAMINATED PRINTED COLOR CONVERSION PHOSPHOR SHEETS

(71) Applicant: eLux Inc., Vancouver, WA (US)

(72) Inventor: Kurt Ulmer, Vancouver, WA (US)

(73) Assignee: eLux, Inc., Vancouver, WA (US)

( * ) Notice: Subject to any disclaimer, the term of this patent is extended or adjusted under 35 U.S.C. 154(b) by 11 days.

(21) Appl. No.: 15/727,662

(22) Filed: Oct. 9, 2017

(65) Prior Publication Data

US 2018/0047710 A1 Feb. 15, 2018

Related U.S. Application Data

(62) Division of application No. 15/197,266, filed on Jun. 29, 2016.

(51) Int. Cl.
| | | |
|---|---|---|
| *H01L 25/075* | (2006.01) | |
| *H01L 33/48* | (2010.01) | |
| *H01L 33/50* | (2010.01) | |
| *H01L 33/54* | (2010.01) | |

(52) U.S. Cl.
CPC ........ *H01L 25/0753* (2013.01); *H01L 33/483* (2013.01); *H01L 33/505* (2013.01); *H01L 33/507* (2013.01); *H01L 33/54* (2013.01); *H01L 2933/0033* (2013.01); *H01L 2933/0041* (2013.01)

(58) Field of Classification Search
CPC ... H01L 33/502; H01L 33/504; H01L 33/505; H01L 33/507; H01L 2933/0041; H01L 25/0753

USPC ........................................................ 438/69
See application file for complete search history.

(56) References Cited

U.S. PATENT DOCUMENTS

| | | | | |
|---|---|---|---|---|
| 6,650,044 B1* | 11/2003 | Lowery | ................ | H01L 33/505 313/498 |
| 7,132,787 B2* | 11/2006 | Ozkan | ................... | B82Y 10/00 313/503 |
| 7,553,683 B2* | 6/2009 | Martin | ...................... | C03C 3/12 257/794 |
| 8,329,485 B2* | 12/2012 | McKean | .............. | C09K 11/025 427/64 |
| 8,445,308 B2* | 5/2013 | Patel | ..................... | H01L 33/505 257/E33.056 |
| 9,054,330 B2* | 6/2015 | Qian | .................... | H01L 51/502 |
| 9,059,114 B2* | 6/2015 | Do | ........................ | H01L 25/0753 |
| 9,324,692 B2* | 4/2016 | Lowenthal | .......... | H01L 25/0753 |
| 9,634,198 B2* | 4/2017 | Needham | .............. | H01L 33/502 |
| 9,902,902 B2* | 2/2018 | Jang | ....................... | B82Y 10/00 |
| 2008/0073495 A1* | 3/2008 | Heckendorn | ........... | G01T 1/169 250/253 |
| 2009/0057690 A1* | 3/2009 | Chakraborty | ........... | H01L 33/44 257/88 |

(Continued)

FOREIGN PATENT DOCUMENTS

| | | | | | |
|---|---|---|---|---|---|
| EP | | 2 175 436 | * | 4/2010 | ............... G09F 9/33 |
| WO | WO | 2018/005232 | * | 1/2018 | ............. H01L 33/00 |

*Primary Examiner* — Mary A Wilczewski
(74) *Attorney, Agent, or Firm* — Law Office of Gerald Maliszewski; Gerald Maliszewski (57) ABSTRACT

Embodiments are related generally to electronic displays and, more particularly, to emissive displays made with transparent sheets having phosphor dots on the surface for the purpose of color conversion.

5 Claims, 5 Drawing Sheets

(56) References Cited

U.S. PATENT DOCUMENTS

| | | | | |
|---|---|---|---|---|
| 2009/0242871 | A1* | 10/2009 | Kobayashi | C09K 11/025 257/13 |
| 2010/0020531 | A1* | 1/2010 | Choi | G02F 1/133617 362/84 |
| 2010/0181582 | A1* | 7/2010 | Li | H01L 33/44 257/91 |
| 2011/0164203 | A1* | 7/2011 | Kimura | G02B 6/0003 349/62 |
| 2011/0254039 | A1* | 10/2011 | Kim | H01L 33/46 257/98 |
| 2012/0061641 | A1* | 3/2012 | Seong | H01L 27/156 257/13 |
| 2012/0094406 | A1* | 4/2012 | Patel | H01L 33/505 438/27 |
| 2014/0098515 | A1* | 4/2014 | Pickett | G09F 13/02 362/23.13 |
| 2014/0124802 | A1* | 5/2014 | Do | H01L 25/0753 257/89 |
| 2015/0286096 | A1* | 10/2015 | Kim | G02B 5/22 349/65 |
| 2018/0005998 | A1* | 1/2018 | Ulmer | H01L 25/0753 |
| 2018/0047710 | A1* | 2/2018 | Ulmer | H01L 25/0753 |

* cited by examiner

METHOD FOR FABRICATING AN EMISSIVE DISPLAY USING LAMINATED PRINTED COLOR CONVERSION PHOSPHOR SHEETS

RELATED APPLICATIONS

Any and all applications, if any, for which a foreign or domestic priority claim is identified in the Application Data Sheet of the present application are hereby incorporated by reference under 37 CFR 1.57.

FIELD OF THE INVENTION

Embodiments are related generally to electronic displays and, more particularly, to emissive displays made with transparent sheets having phosphor dots on the surface for the purpose of color conversion.

BACKGROUND

In a red-blue-green (RGB) display made with a micro light emitting diode (μLED), the μLED disks must be aligned in a regular pixel array in order to allow subsequent processing and integration steps such as metallization. In the simplest embodiment, one type and size of μLED is used, typically emitting a single color such as blue. There are advantages to this type of display for ease of assembly and cost of production. However, color conversion is required in order to make a RGB display from a monochrome μLED light source.

Hence, there exists a need in the art for advanced systems and methods for providing color conversion in an emissive display using a monochrome light source.

SUMMARY

Embodiments are related generally to electronic displays and, more particularly, to emissive displays made with transparent sheets having phosphor dots on the surface for the purpose of color conversion.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related generally to electronic displays and, more particularly, to emissive displays made with transparent sheets having phosphor dots on the surface for the purpose of color conversion.

Various embodiments provide emissive displays using printed phosphor color conversion sheets. The displays include: a backplane comprising a top surface with a first number of light emitting diode (LED) devices aligned in an array; and a first transparent substrate attached to the top surface of the backplane. The first transparent substrate includes a top surface having a second number of printed phosphor dots. The second number of printed phosphor dots overly a subset of the first number of the LED devices. In some cases, the first number is equal to the second number, and as such the printed phosphor dots overly all of the LED devices. In other cases, the second number is less than the first number.

In some instances of the aforementioned embodiments, the display further includes a transparent adhesive interposed between the first transparent substrate and the top surface of the backplane. In some cases, the first transparent substrate and transparent adhesive have a combined thickness of greater than 20 microns. In various instances of the aforementioned embodiments, the first transparent substrate is formed of either plastic and glass. In one or more instances of the aforementioned embodiments, the first transparent substrate is formed of either polyethylene naphthalate (PEN), or polyethylene terephthalate (PET).

In some instances of the aforementioned embodiments, the first number of LED devices are each configured to emit light in a given spectrum, and the second number of printed phosphor dots are each configured to emit light in a visible spectrum. In various instances of the aforementioned embodiments, the first number of LED devices are each configured to emit light in a visible spectrum with a first color, and the second number of printed phosphor dots are each configured to emit light in the visible spectrum with a second color different from the first color, and the first number is greater than the second number.

In one or more instances of the aforementioned embodiments, the first number of LED devices are each configured to emit light in a visible spectrum with a first color, a first subset of the second number of printed phosphor dots are each configured to emit light in the visible spectrum with a second color, and a second subset of the second number of printed phosphor dots are each configured to emit light in the visible spectrum with a third color. The first color is different than the second color, and the third color is different from both the first color and the second color. In some cases, the first transparent substrate is organized into a plurality of pixels, each pixel including one of the first subset of the second number of printed phosphor dots, one of the second subset of the second number of printed phosphor dots, and an adjacent region of the first transparent substrate exposing one of the first number of LED devices underlying the adjacent region. In various cases, the first subset of the second number of printed phosphor dots are each formed of a first type of phosphor material having a first luminescence and a first light absorption characteristic, the second subset of the second number of printed phosphor dots are formed of a second type of phosphor material having a second luminescence and a second light absorption characteristic. The first luminescence is different from the second luminescence and the first light absorption characteristic is different than the second light absorption characteristic. A first subset of the first number of LED devices underlying the first subset of the second number of printed phosphor dots each have a first diameter, a second subset of the first number of LED devices underlying the second subset of the second number of printed phosphor dots each have a second diameter, and a third subset of the first number of LED devices exposed by the first transparent substrate each have a third diameter.

In some instances of the aforementioned embodiments, where the subset of the first number of the LED devices is a first subset of the first number of LED devices, the first number of LED devices are each configured to emit light in a visible spectrum with a first color, and the second number of printed phosphor dots are each configured to emit light in the visible spectrum with a second color different than the first color; the display further includes a second transparent substrate laminated to the top surface of the first transparent substrate. The second transparent substrate includes a pattern of a third number of printed phosphor dots overlying a second subset of the first number of LED devices, where the first subset of the first number of LED devices is exclusive of the second subset of the first number of LED devices. The third number is less than the first number. In some cases, the first transparent substrate and the second transparent substrate are organized into a plurality of pixels. Each pixel includes a first area on the first transparent substrate and a second area on the second transparent substrate. The first area includes: one of the second number of printed phosphor dots configured to emit light in the visible spectrum with the second color, and a first adjacent region exposing two of the first number of LED devices underlying the first adjacent region. The second area includes: one of the third number of printed phosphor dots configured to emit light in the visible spectrum with the third color, and a second adjacent region exposing one of the second number of printed phosphor dots and one of the two of the first number of LED devices underlying the first adjacent region. In one or more cases, the second number of printed phosphor dots on the first transparent substrate are formed of a first type of phosphor material having a first luminescence and a first light absorption characteristic, with a first diameter responsive to the first luminescence and a first thickness responsive to the first light absorption characteristic; the third number of printed phosphor dots on the second transparent substrate exhibit a second luminescence and second light absorption characteristic, different than the first luminescence and first light absorption characteristic, with a second diameter responsive to the second luminescence and a second thickness responsive to the second light absorption characteristic, different than the first diameter and first thickness. In some particular cases, the first subset of the first number of LED devices each have a third diameter, the second subset of the first number of LED devices each have a fourth diameter, and a third subset of the first number of LED devices exposed through both the first transparent substrate and the second transparent substrate each have a fifth diameter.

Other embodiments provide methods for fabricating an emissive display. The methods include: providing a backplane having a top surface with a first number of light emitting diode (LED) devices formed in an array; mixing a phosphor material with a binder to yield a phosphor mixture; inking a pattern plate with the phosphor mixture to yield a phosphor ink pattern; transferring the phosphor ink pattern to a transparent substrate top surface to yield a pattern of a second number of phosphor dots; aligning the transparent substrate so the pattern of the second number of phosphor dots overlies a subset of the first number of LED devices; and laminating a bottom surface of the transparent substrate to the backplane top surface.

Figure 1A:
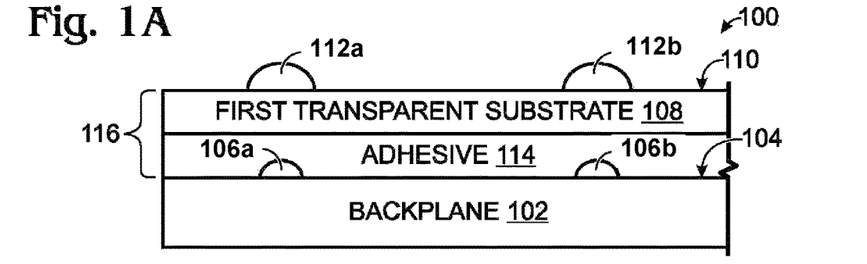
FIGS. 1A-1B depict cross-sectional and plan views of an emissive display using printed phosphor color conversion sheets in accordance with various embodiments of the present inventions.
Figure 1B:
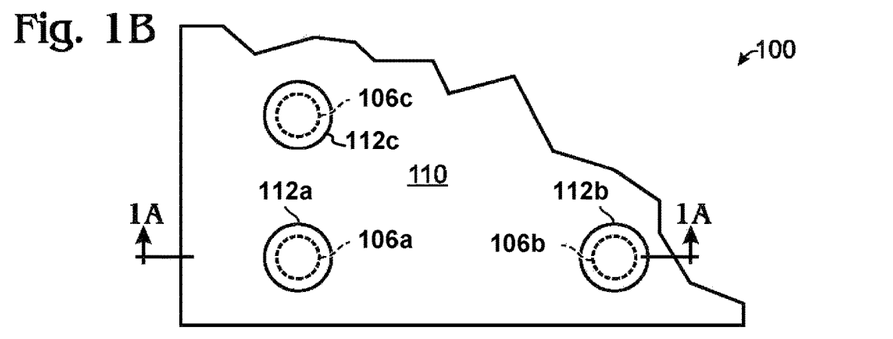

FIGS. 1A and 1B are, respectively, cross-sectional and plan views of an emissive display 100 using printed phosphor color conversion sheets in accordance with various embodiments of the present inventions. As used herein, the phrase "emissive display" is used in its broadest sense to refer to any display that enables one or more pixels by energizing a corresponding pixel light source. Display 100 includes a backplane 102 having a top surface 104 with a number of light emitting diode (LED) devices 106 aligned in an array. Backplane 102 may be made of any material suitable for holding LED devices 106. In one particular embodiment, backplane 102 is formed of a glass substrate with metalized layers (not shown) for providing electrical connection to LED devices 106. Based upon the disclosure provided herein, one of ordinary skill in the art will recognize a variety of materials that may be used for backplane 102 in accordance with different embodiments of the present inventions. In the embodiment of FIGS. 1A and 1B, LED devices 106 are oriented in such a way that display 100 is top emitting, meaning the bulk of the light coming from the LED devices 106 is directed "upward", away from the backplane.

A first transparent substrate 108 having a top surface 110 is attached (e.g., laminated) to a top surface 104 of backplane 102 by a transparent adhesive 114 interposed between first transparent substrate 108 and top surface 104 of backplane 102. Top surface 110 of first transparent substrate 108 includes a pattern of printed phosphor dots 112 (individual instances are respectively indicated as reference 112a and reference 112b). First transparent substrate 108 overlies a subset of LED devices 106 (individual instances are respectively indicated as reference 106a. reference 106b and 106c). LED devices 106 are designed to emit light in a given spectrum and the printed phosphor dots 112 are designed to emit light in a visible spectrum. First transparent substrate 108 may be formed of any material that is capable allowing light from LED devices 106 to pass through to phosphor dots 112. As one example, first transparent substrate 108 may be a plastic material or glass. A plastic material may be, but is not limited to, polyethylene naphthalate (PEN) or polyethylene terephthalate (PET). Based upon the disclosure provided herein, one of ordinary skill in the art will recognize a variety of materials that may be used to form first transparent substrate in accordance with different embodiments. Adhesive 114 may be any material capable of attaching first transparent substrate 108 to backplane 102 and allowing light from LED devices 106 to pass through to first transparent substrate 108.

In some embodiments, first transparent substrate 108 and transparent adhesive 114 have a combined thickness 116 of greater than 20 microns (μm). In various embodiments, the thickness of first transparent substrate 108 is at least 10 μm, and the thickness of transparent adhesive 114 is at least 10 μm. In one particular embodiment, first transparent substrate 108 is a 50 μm thick PEN film or PET film that has a 50 μm thick silicone backing adhesive applied.

In some embodiments, the number of LED devices 106 is equal to the number of printed phosphor dots 112. Such an arrangement may be particularly useful where the spectrum of light emitted by LED devices 106 is non-visible (e.g., ultraviolet). In such a case all of printed phosphor dots 112 may be made of a single color phosphor material to create a monochrome display. Alternatively, subsets of printed phosphor dots 112 may be made of respective phosphor materials designed to emit either read, green or blue colored light to create a red-blue-green (RGB) display. In FIG. 1B the LEDs 106 underlying the phosphor dots 112 are shown in phantom (e.g., LED device 106a underlying printed phosphor dot 112a).

Turning to FIGS. 2A through 2D, cross-sectional and plan views of an emissive display 200 are shown in accordance with some embodiments of the present inventions. Display 200 includes a backplane 202 having a top surface 204 with a number of light emitting diode (LED) devices 206 (individual instances are respectively indicated as reference 206a, reference 206b, reference 206c, reference 206d. reference 206e, and reference 206g) aligned in an array. Backplane 202 may be made similar to that discussed above in relation to backplane 102. In the embodiments of FIGS. 2A through 2D, LED devices 206 are oriented in such a way that display 200 is top emitting, meaning the bulk of the light coming from the LED devices 206 is directed "upward", away from the backplane.

A first transparent substrate 208 is attached to top surface 204 of backplane 202 by a transparent adhesive 214 interposed between first transparent substrate 208 and top surface 204 of backplane 202. First transparent substrate 208 includes a top surface 210 with a pattern of printed phosphor dots 212 (individual instances are respectively indicated as reference 212a and reference 212b). First transparent substrate 208 overlies a subset of LED devices 206. LED devices 206 are designed to emit light in a given spectrum and the printed phosphor dots 212 are designed to emit light in a visible spectrum. First transparent substrate 208 may be formed similar to that discussed above in relation to first transparent substrate 108, and transparent adhesive 214 may be formed similar to that discussed above in relation to transparent adhesive 114. In FIGS. 2B and 2D, LED devices 206 underlying the phosphor dots 212 are shown in phantom (e.g., LED device 206b underlying printed phosphor dot 212a).

Figure 2A:
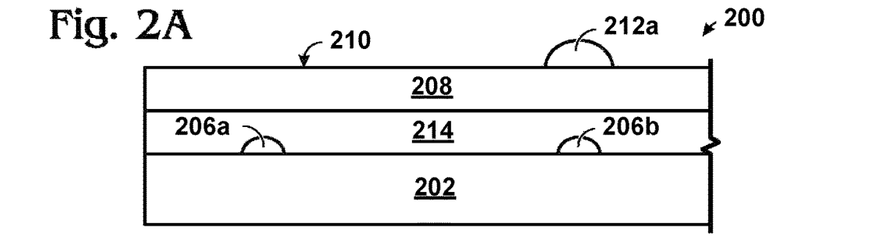
FIGS. 2A-2D show cross-sectional and plan views of an emissive display in accordance with some embodiments of the present inventions.
Figure 2B:
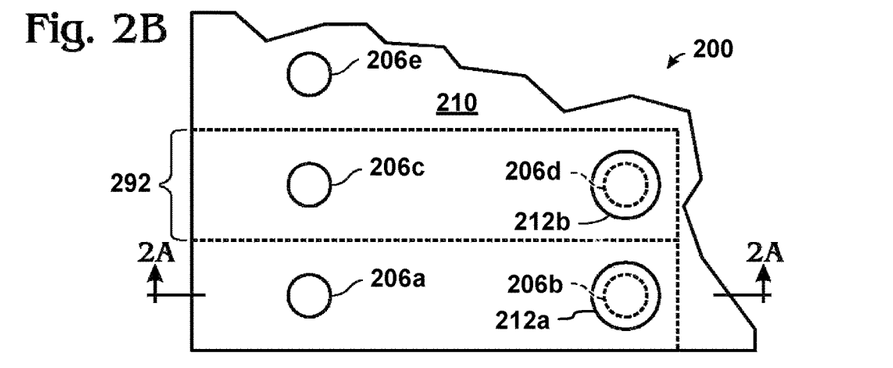

In particular instances of the embodiments of FIGS. 2A through 2B, LED devices 206 are designed to emit light in a visible spectrum with a first color, and the printed phosphor dots 112 are designed to emit light in the visible spectrum with a second color different from the first color. Where, as shown, the number of printed phosphor dots 212 is greater than the number of LED devices 206, display 200 emits at least two colors for a pixel 292. Notably, display 200 includes a number of pixels including two LED devices 206 with one of the two covered by a printed phosphor dot 212 and the other only covered by an area of first transparent substrate 208 and transparent adhesive 214 (e.g., pixel 292 including LED device 206d covered by printed phosphor dot 212b, and LED device 206c). Using pixel 292 as an example, light in the first color emitted from LED device 206c and light in the second color emitted by printed phosphor 212b is provided from pixel 292.

Figure 2C:
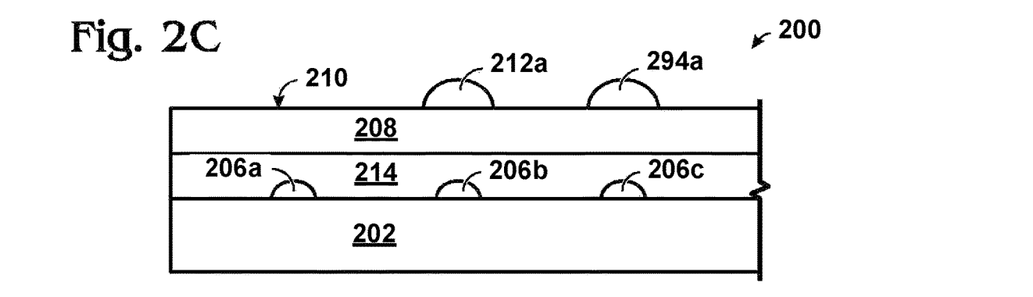
Figure 2D:
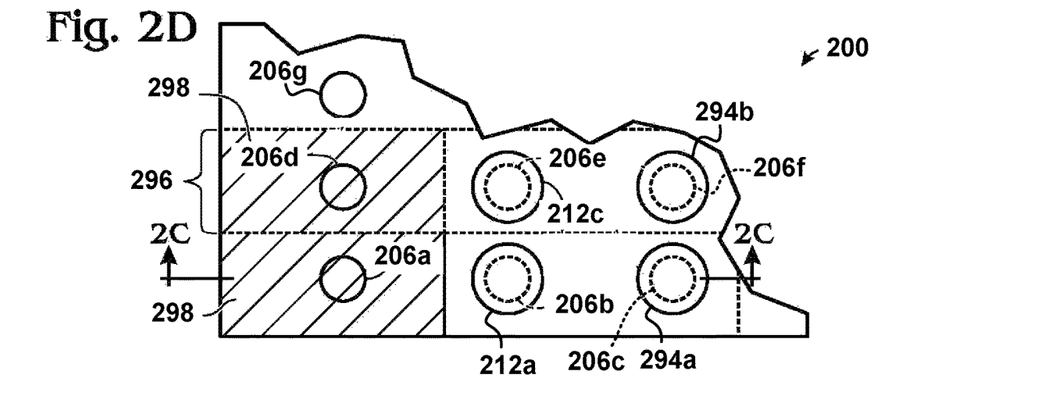

In the embodiment of FIGS. 2C through 2D, printed phosphor dots 212 and printed phosphor dots 294 (individual instances are respectively indicated as reference 294a and reference 294b) are included. LED devices 206 are designed to emit light in a visible spectrum with a first color, printed phosphor dots 212 are designed to emit light in a visible spectrum with a second color, and printed phosphor dots 294 are designed to emit light in a visible spectrum with a third color. In some cases, the first color, the second color, and the third color are blue, green and red, respectively. In other embodiments, other combinations of blue, green and red may be emitted by respective ones of LED devices 206, printed phosphor dots 212, and printed phosphor dots 294. Similar to the previously described embodiments, in the embodiments shown in FIGS. 2C and 2D, display 200 includes a number of pixels including three LED devices 206 with one of the three covered by a printed phosphor dot 212, another of the three covered by a printed phosphor dot 294, and the last of the three covered only by an area 298 (shown as a cross-hatched region) of first transparent substrate 208 and transparent adhesive 214 that allows light of the first color emitted from an underlying LED device 206 to pass (e.g., pixel 296 including LED device 206e covered by printed phosphor dot 212c, LED device 206f covered by printed phosphor dot 294b, and LED device 206d). Using pixel 296 as an example, light in the first color emitted from LED device 206d, light in the second color emitted by printed phosphor 212c, and light in the third color emitted by printed phosphor 294b is provided from pixel 296. LED devices 206 that underlie printed phosphor dots 212 and printed phosphor dots 294 are shown in phantom (e.g., LED device 206e underlying printed phosphor dot 212c). As such, each pixel in display 200 emits at least three colors for each pixel 296.

Figure 3A:
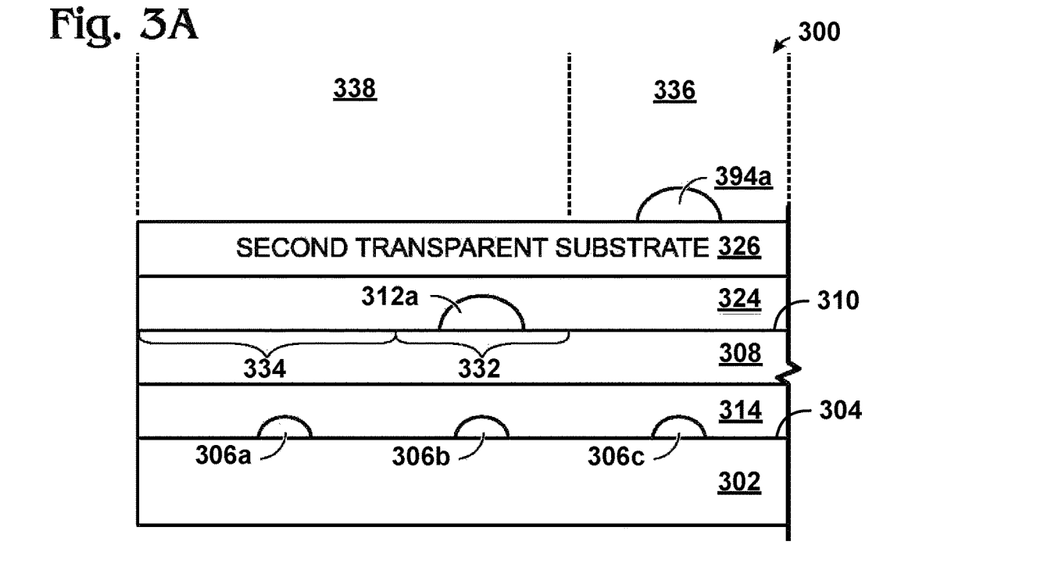
FIGS. 3A-3B depict cross-sectional and plan views of an emissive display in accordance with one or more embodiments of the present inventions.
Figure 3B:
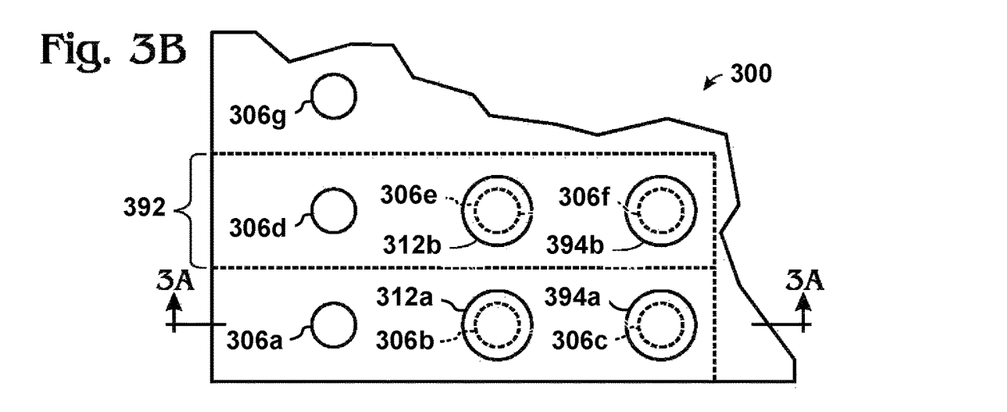

Turning to FIGS. 3A through 3B, cross-sectional and plan views of an emissive display 300 are shown in accordance with some embodiments. Display 300 includes a backplane 302 having a top surface 304 with a number of light emitting diode (LED) devices 306 (individual instances are respectively indicated as reference 306a, reference 306b, reference 306c, reference 306d, reference 306e, reference 306f and reference 306g) aligned in an array. Backplane 302 may be made similar to that discussed above in relation to Backplane 102. In the embodiment of FIGS. 3A and 3B, LED devices 306 are oriented in such a way that display 300 is top emitting, meaning the bulk of the light coming from the LED devices 306 is directed "upward", away from backplane 302.

A first transparent substrate 308 is attached (e.g., laminated) to top surface 304 of backplane 302 by a transparent adhesive 314 interposed between first transparent substrate 308 and top surface 304 of backplane 302. First transparent substrate 308 includes a top surface 310 with a pattern of printed phosphor dots 312 (individual instances are respectively indicated as reference 312a and reference 312b). First transparent substrate 308 overlies a subset of LED devices 306. LED devices 306 are designed to emit light in a given spectrum and the printed phosphor dots 312 are designed to emit light in a visible spectrum. First transparent substrate 308 may be formed similar to that discussed above in relation to first transparent substrate 108, and transparent adhesive 314 may be formed similar to that discussed above in relation to transparent adhesive 114.

A second transparent substrate 326 is attached (e.g., laminated) to top surface 310 of first transparent substrate 308 by a transparent adhesive 324 interposed between second transparent substrate 326 and top surface 310 of first transparent substrate 308. Second transparent substrate 326 includes a pattern of printed phosphor dots 394 (individual instances are respectively indicated as reference 394a and reference 394b) that overlies a subset of LED devices 306. Printed phosphor dots 394 are designed to emit light in a visible spectrum. Second transparent substrate 326 may be formed similar to that discussed above in relation to first transparent substrate 108, and transparent adhesive 324 may be formed similar to that discussed above in relation to transparent adhesive 114. In FIG. 3B, LED devices 306 underlying the phosphor dots 312, 394 are shown in phantom (e.g., LED device 306e underlying printed phosphor dot 312b, and LED device 306f underlying printed phosphor dot 394b).

In particular instances of the embodiments of FIGS. 3A through 3B, LED devices 306 are designed to emit light in a visible spectrum with a first color, printed phosphor dots 312 are designed to emit light in the visible spectrum with a second color different from the first color, and printed phosphor dots 394 are designed to emit light in the visible spectrum with a third color different from both the first color and the second color. First transparent substrate 308 and second transparent substrate 326 are organized into a number of pixels. An example of one of the number of pixels is shown as a pixel 392 that includes: a first area 334 on first transparent substrate 308 and a second area 338 on second transparent substrate 326 that together allow light of the first color to pass; a printed phosphor dot 312 and second area 338 on second transparent substrate 326 that allows light of the second color to pass; and a printed phosphor dot 394 that emits light of the third color. Thus, in the embodiment shown in FIGS. 3A through 3B, display 300 emits at least three colors for each of the number of pixels.

Figure 4A:
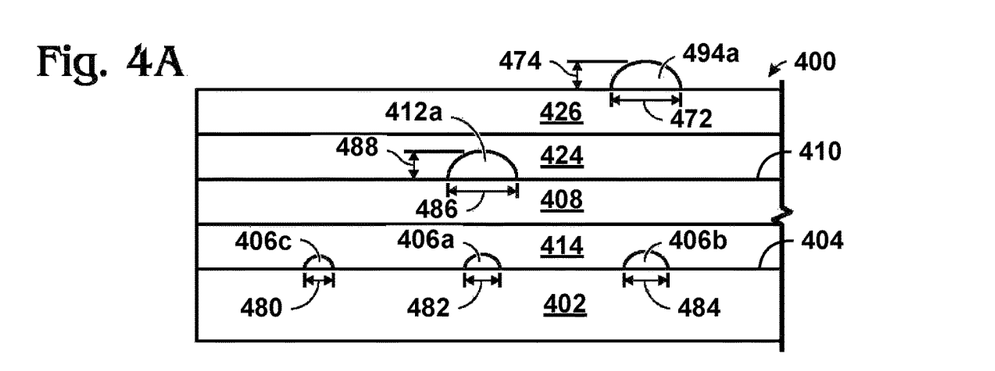
FIGS. 4A-4B depict cross-sectional and plan views of an emissive display in accordance with various embodiments of the present inventions.
Figure 4B:
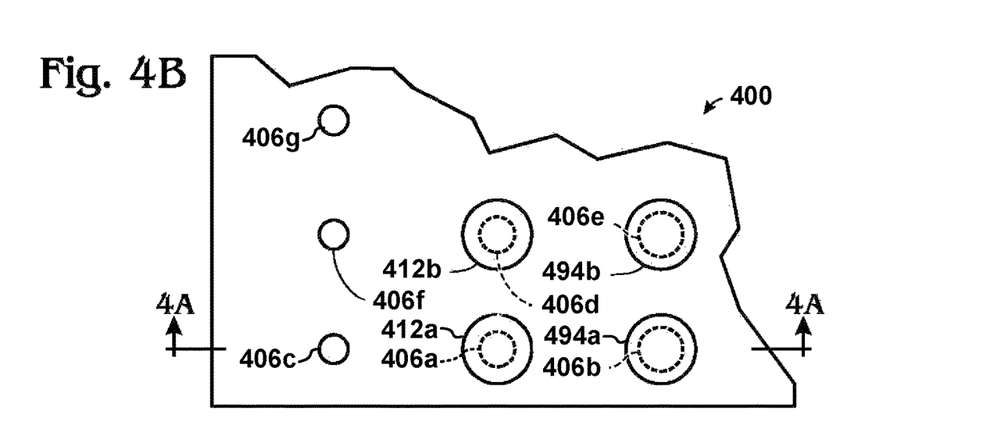

Turning to FIGS. 4A through 4B, cross-sectional and plan views of an emissive display 400 are shown in accordance with various embodiments. Display 400 includes a backplane 402 having a top surface 404 with a number of light emitting diode (LED) devices 406 (individual instances are respectively indicated as reference 406a, reference 406b, reference 406c, reference 406d, reference 406e, and reference 406g) aligned in an array. Backplane 402 may be made similar to that discussed above in relation to Backplane 102. A first transparent substrate 408 is attached (e.g., laminated) to top surface 404 of backplane 402 by a transparent adhesive 414 interposed between first transparent substrate 408 and top surface 404 of backplane 402. First transparent substrate 408 includes a pattern of printed phosphor dots 412 (individual instances are respectively indicated as reference 412a and reference 412b) on top surface 410. In this embodiment, printed phosphor dots 412 on first transparent substrate 408 are formed of a first type of phosphor material having a first luminescence and a first light absorption characteristic, with a first diameter 486 responsive to the first luminescence and a first thickness 488 responsive to the first light absorption characteristic. First transparent substrate 408 overlies a subset of LED devices 406. LED devices 406 are designed to emit light in a given spectrum and the printed phosphor dots 412 are designed to emit light in a visible spectrum. First transparent substrate 408 may be formed similar to that discussed above in relation to first transparent substrate 108, and transparent adhesive 414 may be formed similar to that discussed above in relation to transparent adhesive 114.

A second transparent substrate 426 is attached (e.g., laminated) to top surface 410 of first transparent substrate 408 by a transparent adhesive 424 interposed between second transparent substrate 426 and top surface 410 of first transparent substrate 408. Second transparent substrate 426 includes a pattern of printed phosphor dots 494 (individual instances are respectively indicated as reference 494a and reference 494b) that overlies a subset of LED devices 406. Printed phosphor dots 494 on second transparent substrate 426 have a second luminescence and second light absorption characteristic, different than the first luminescence and first light absorption characteristic. Printed phosphor dots 494 have a second diameter 472 responsive to the second luminescence and a second thickness 474 responsive to the second light absorption characteristic, different than the first diameter 486 and first thickness 488. Second transparent substrate 426 may be formed similar to that discussed above in relation to first transparent substrate 108, and transparent adhesive 424 may be formed similar to that discussed above in relation to transparent adhesive 114. In FIG. 4B, LED devices 406 underlying the phosphor dots 412, 494 are shown in phantom (e.g., LED device 406d underlying printed phosphor dot 412b, and LED device 406e underlying printed phosphor dot 494b).

Figure 5A:
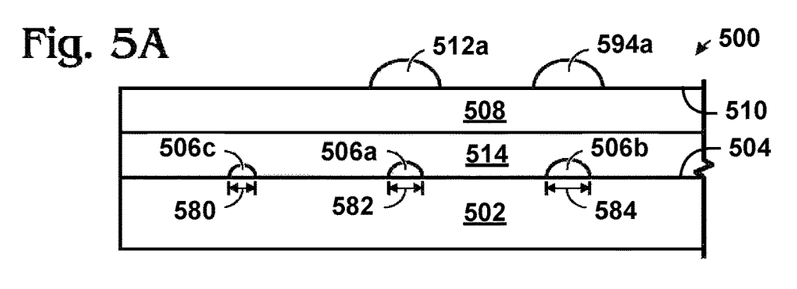
FIGS. 5A-5B depict cross-sectional and plan views of an emissive display in accordance with other embodiments of the present inventions.
Figure 5B:
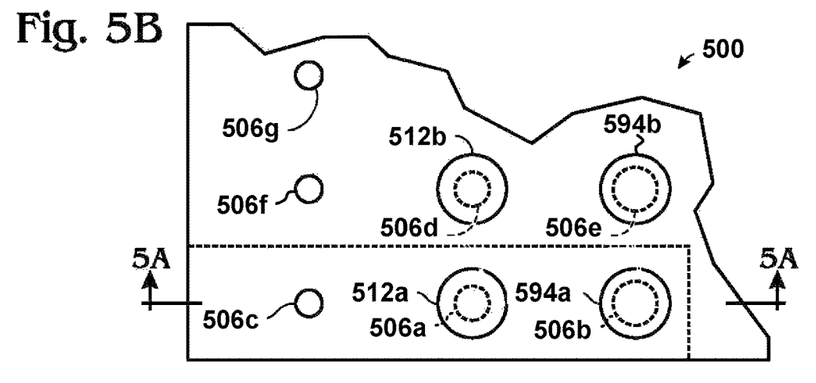

Optionally as shown, the LED devices underlying the phosphor dots 412 on first transparent substrate 408 (e.g., LED device 406a) have a third diameter 482, LED devices underlying the phosphor dots 494 on second transparent substrate 426 (e.g., LED device 406b) have a fourth diameter 484, and the LED devices exposed by the first transparent substrate 408 and second transparent substrate 426 (e.g., LED device 406c) have a fifth diameter 480. Different sized LED devices, phosphor dot diameters, and phosphor dot thicknesses may be used as compensation mechanisms to ensure that the colors emitted by the display are perceived as uniform. Otherwise, the LED devices may all have the same diameter, and the phosphor dots all have the same diameter and thickness. Alternatively, the diameters of printed phosphor dots 412 and printed phosphor dots 494 may have the same diameter (i.e., diameter 408 and diameter 412 are the same), with just the diameters of the underlying LED devices (i.e., diameters 480, 482, 484) varying to achieve the desired result. This option is shown in FIGS. 5A and 5B, where all the phosphor dots (of both colors) are formed on a single transparent substrate. As another alternative, the diameters of the LED devices may all be the same with the diameters and thicknesses of the phosphor materials varying.

Turning to FIGS. 5A and 5B, cross-sectional and plan views of an emissive display 500 are shown in accordance with some embodiments. Display 500 includes a backplane 502 having a top surface 504 with a number of light emitting diode (LED) devices 506 (individual instances are respectively indicated as reference 506a, reference 506b, reference 506c, reference 506d, reference 506e, and reference 506g) aligned in an array. Backplane 502 may be made similar to that discussed above in relation to Backplane 102. A first transparent substrate 508 is attached to top surface 504 of backplane 502 by a transparent adhesive 514 interposed between first transparent substrate 508 and top surface 504 of backplane 502. First transparent substrate 508 includes a top surface 510 with a pattern of printed phosphor dots 512 (individual instances are respectively indicated as reference 512a and reference 512b) and printed phosphor dots 594. First transparent substrate 508 overlies a subset of LED devices 506. LED devices 506 are designed to emit light in a visual spectrum with a first color, printed phosphor dots 512 have a first type of phosphor material having a first luminescence and a first light absorption characteristic yielding a second color, and printed phosphor dots 594 (individual instances are respectively indicated as reference 594a and reference 594b) have a first type of phosphor material having a first luminescence and a first light absorption characteristic yielding a third color. First transparent substrate 508 may be formed similar to that discussed above in relation to first transparent substrate 108, and transparent adhesive 514 may be formed similar to that discussed above in relation to transparent adhesive 114. In FIG. 5B, LED devices 506 underlying printed phosphor dots 512 and printed phosphor dots 594 are shown in phantom (e.g., LED device 506d underlying printed phosphor dot 512b, and LED device 506e underlying printed phosphor dot 594b).

In some embodiments, the diameters of the LEDs may all be the same diameter (i.e., diameters 580, 582, 584 are the same). Alternatively, LED devices underlying phosphor dots 512 on first transparent substrate 508 (e.g., LED device 506a) have a first diameter 582, LED devices underlying the phosphor dots 594 on second transparent substrate 526 (e.g., LED device 506b) have a second diameter 584, and the LED devices exposed by the first transparent substrate 508 and second transparent substrate 526 (e.g., LED device 506c) have a third diameter 580. In another alternative not shown, the diameters of printed phosphor dots 512, printed phosphor dots 594, and the diameters of LED devices 506 may vary.

Materials to create the printed phosphor dots described above in relation to FIGS. 1-5 may be mixed into a phosphor binder. In one process, commercially available red and green phosphor materials were used that had particle sizes with about an 8 μm diameter. However, the particle size of the phosphor is not critical to the effectiveness of the device structure. The particles are mixed with an appropriate binder material that is suitable for the printing process used to pattern the phosphor dots.

In some embodiments, phosphor ink is printed onto flexible transparent substrates. In one process, a gravure printing technique was used that entails inking a pattern plate, wiping excess ink from the pattern plate, and subsequently transferring the phosphor ink pattern from the pattern plate to a flexible web material (i.e., transparent substrate). Other printing techniques that can also be applied for this process are screen printing, flexography, offset printing, and extrusion. In the process, the phosphor ink was thermally cured on a hotplate at 140° C. for 8 minutes. Further processing may be dictated by the specific materials used for the phosphor and binder.

Figure 6:
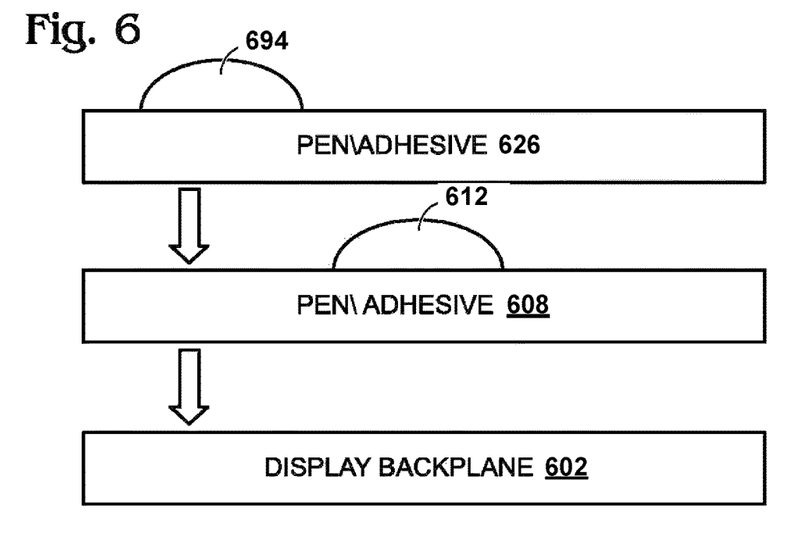
FIG. 6 is a partial cross-sectional view depicting a lamination process that may be used in relation to various embodiments of the present inventions.

Turning to FIG. 6, a partial cross-sectional view depicts a lamination process that may be used in relation to various embodiments. Adhesive is applied to respective flexible transparent substrates to yield respective PEN/adhesive layers 308, 326 and a display backplane 602 are attached using a lamination process which includes a combination of temperature and/or pressure. As described above in FIGS. 2C and 2D for example, two colors of printed phosphor dots (e.g., printed phosphor dots 206 in green and printed phosphor dots 294 in red) may be patterned on a single substrate to be laminated to a display backplane. In such a case, only one PEN/adhesive layer is laminated to the display backplane.

Figure 7:
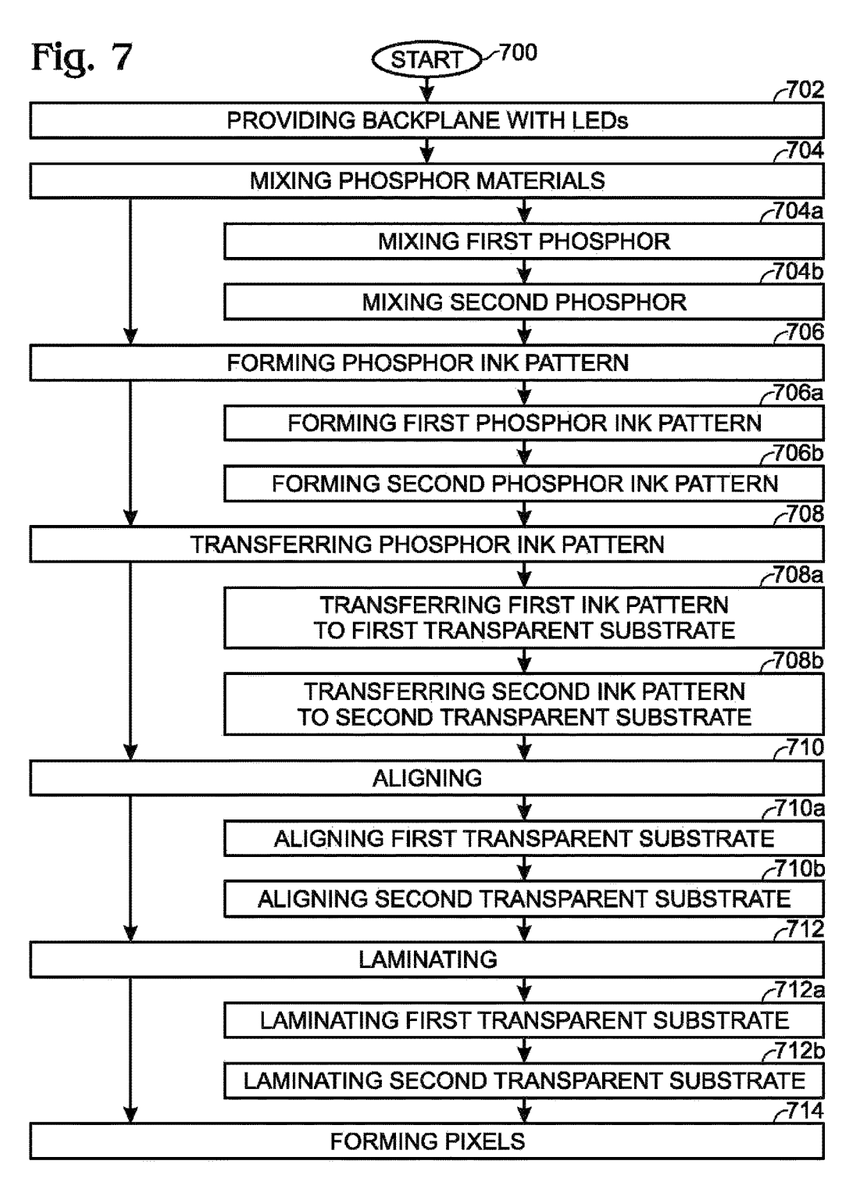
FIG. 7 is a flowchart illustrating a method for fabricating an emissive display in accordance with various embodiments of the present inventions.

Turning to FIG. 7, is a flowchart 700 illustrates a method for fabricating an emissive display in accordance with some embodiments. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally, however, the method follows the numeric order of the depicted steps. Step 702 provides a backplane having a top surface with a first plurality of light emitting diodes (LEDs) formed in an array. The method is not dependent upon the manner in which the LEDs are formed on the backplane. Further, although the figures described above generally depict the backplane as have a planar top surface, in other aspects the LEDs may be mounted in plateaus or cavities in the backplane top surface. Step 704 mixes a phosphor material with a binder, forming a phosphor mixture. Alternatively, the phosphor mixtures may be provided from a vendor as a commercial product, and Step 704 is not required. Step 706 inks a pattern plate with the phosphor mixture, forming a phosphor ink pattern. Step 708 transfers the phosphor ink pattern to a transparent substrate top surface, forming a pattern of phosphor dots. Step 710 aligns the transparent substrate so the pattern of phosphor dots overlies a second plurality of LEDs, and Step 712 laminates the bottom surface of the transparent substrate to the backplane top surface.

In one aspect, Step 708 transfers the phosphor ink pattern to a transparent substrate having a thickness of greater than 10 microns. Step 712 laminates the bottom surface of the transparent substrate to the backplane top surface by interposing a transparent adhesive between the transparent substrate bottom surface and backplane top surface having a thickness of greater than 10 microns. Then, a temperature, pressure, or both temperature and pressure processes are used to complete the lamination.

In one aspect (see FIGS. 1A and 1B), Step 702 provides LEDs capable of emitting light in a first spectrum, and Step 704 mixes a phosphor material capable of emitting light in a visible spectrum. The LEDs may be capable of emitting light in a visible spectrum with a first color, while the phosphor material may be capable of emitting light in the visible spectrum with a second color, different from the first color (see FIGS. 2A and 2B). In this case, Step 706 forms a pattern with a second plurality of phosphor dots, less than the first plurality of LEDs. Alternatively, the LEDs may emit light in a non-visible spectrum, in which case the phosphor dots may overlie every LED in a monochrome display.

In another aspect (see FIGS. 3A and 3B), Step 704a mixes a first phosphor material capable of emitting light in the visible spectrum with a second color different than the first color, and Step 704b mixes a second phosphor material capable of emitting light in the visible spectrum with a third color, different than the first and second colors. Then, Step 706 forms a first plurality of phosphor dots made from the first phosphor material and a second plurality of phosphor dots made from the second phosphor material. Ultimately, Step 714 forms a plurality of pixels. Each pixel comprises a phosphor dot made from the first phosphor material, an adjacent phosphor dot made from the second phosphor material, and an adjacent region of the transparent substrate exposing an underlying LED.

Alternatively, Step 706a forms a first pattern with a first plurality of phosphor dots made from the first phosphor material, and Step 706b forms a second pattern comprising a second plurality of phosphor dots made from the second phosphor material. Then, Step 708a transfers the first pattern of phosphor dots to a first transparent substrate top surface, and Step 708b transfers the second pattern of phosphor dots to a second transparent substrate top surface. Step 710a aligns the first transparent substrate over the backplane so the phosphor dots overlie a second plurality of LEDs, less than the first plurality of LEDs. Step 710b aligns the second transparent substrate over the first transparent substrate so the phosphor dots overlie a third plurality of LEDs, which is a different set of LEDs than the second plurality of LEDs and less in number than the first plurality of LEDs. Step 712a laminates the bottom surface of the first transparent substrate to the backplane top surface, and Step 712b laminates the bottom surface of the second transparent substrate to the top surface of the first transparent substrate. Alternatively, the first and second transparent substrates may be aligned and laminated to form an assembly, and then the assembly is aligned and laminated to the backplane. Finally, Step 714 forms the plurality of pixels as follows. Each pixel comprises a first area on the first transparent sheet comprising a phosphor dot with the second color and an adjacent region exposing an underlying LED. A second area on the second transparent sheet comprises a phosphor dot having the third color and an adjacent region exposing the first area and adjacent region of the first transparent substrate.

In one aspect, Step 704a mixes a first phosphor material having a first luminescence and a first light absorption characteristic, and Step 704b mixes a second phosphor material having a second luminescence and a second light absorption characteristic, different than the first luminescence and first light absorption characteristic. Then, Step 706a forms a phosphor dot first diameter responsive to the first luminescence and a thickness responsive to the first light absorption characteristic. Likewise, Step 706b forms a phosphor dot second diameter, responsive to the second luminescence and different than the phosphor dot first diameter, and a second thickness, responsive to the second light absorption characteristic and different than the first thickness.

Alternatively, or in addition to the use of different phosphor dot diameters and thicknesses, the LED diameters may vary according the color they illuminate. Thus, Step 702 may provide LEDs underlying the phosphor dots on the first transparent sheet having a third diameter, with the LEDs underlying the phosphor dots on the second transparent sheet having a fourth diameter, and with the LEDs exposed by the first and second transparent sheets having a fifth diameter. Likewise, the LED diameters may vary according the phosphor dot material being illuminated when both the first and second phosphor materials are formed on the same transparent substrate.

One of ordinary skill in the art will recognize various advantages achievable through use of different embodiments of the inventions. As just some of many advantages, lower display costs are possible. Based upon the disclosure provided herein, one of ordinary skill in the art will recognize a variety of other advantages achievable through use of one or more embodiments of the present inventions.

In conclusion, the invention provides novel systems, devices, methods and arrangements for displays. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. As another example, while embodiments using one or two colors of printed phosphors are disclosed, the scope of the technology is not limited to any particular number of phosphor colors. As yet another example, while embodiments using one or two transparent substrates are disclosed, the scope of the technology is not limited to any particular number of transparent substrates. Therefore, the above description should not be taken as limiting the scope of the invention, which is defined by the appended claims.

The invention claimed is:

1. A method for fabricating an emissive display, the method comprising:
   providing a backplane having a top surface with a first number of light emitting diode (LED) devices formed in an array and configured to emit light in a visible spectrum with a first color;
   mixing a phosphor material with a binder to yield a phosphor mixture as follows:
      mixing a first phosphor material configured to emit light in the visible spectrum with a second color different than the first color;
      mixing a second phosphor material configured to emit light in the visible spectrum with a third color, different than the first and second colors;
   inking a pattern plate with the phosphor mixture to yield a phosphor ink pattern as follows:
      forming a first pattern with a first plurality of phosphor dots made from the first phosphor material:
      forming a second pattern comprising a second plurality of phosphor dots made from the second phosphor material;
   transferring the phosphor ink pattern to a transparent substrate top surface to yield a pattern of a second number of phosphor dots as follows:
      transferring the first pattern of phosphor dots to a first transparent substrate top surface;
      transferring the second pattern of phosphor dots to a second transparent substrate top surface;
   aligning the transparent substrate so the pattern of the second number of phosphor dots overlies a subset of the first number of LED devices as follows:
      aligning the first transparent substrate over the backplane so the phosphor dots overlie a second plurality of LED devices, less than the first plurality of LED devices;
      aligning the second transparent substrate over the first transparent substrate so the phosphor dots overlie a third plurality of LED devices, different than the second plurality of LED devices and less than the first plurality of LED devices; and,
   laminating a bottom surface of the transparent substrate to the backplane top surface as follows:
      laminating a bottom surface of the first transparent substrate to the backplane top surface; and,
      laminating a bottom surface of the second transparent substrate to the top surface of the first transparent substrate.

2. The method of claim 1, the method further comprising:
   forming a plurality of pixels, wherein each of the plurality of pixels includes:
      a first area on the first transparent sheet comprising a phosphor dot with the second color and an adjacent region exposing an underlying LED device; and, a second area on the second transparent sheet comprising a phosphor dot having the third color and an adjacent region exposing the first area and adjacent region of the first transparent substrate.

3. The method of claim 1, wherein:

mixing the first phosphor material includes the first phosphor material having a first luminescence and a first light absorption characteristic;

mixing the second phosphor material includes the second phosphor material having a second luminescence and a second light absorption characteristic, different than the first luminescence and first light absorption characteristic;

forming the first pattern includes forming a phosphor dot first diameter responsive to the first luminescence and a thickness responsive to the first light absorption characteristic; and forming the second pattern includes forming a phosphor dot second diameter, responsive to the second luminescence and different than the phosphor dot first diameter, and a second thickness, responsive to the second light absorption characteristic and different than the first thickness.

4. The method of claim 3, wherein providing the backplane includes the LED devices underlying the phosphor dots on the first transparent sheet having a third diameter, the LED devices underlying the phosphor dots on the second transparent sheet having a fourth diameter, and the LED devices exposed by the first and second transparent sheets having a fifth diameter.

5. The method of claim 1, wherein:

transferring the phosphor ink pattern to the transparent substrate includes the first transparent substrate having a thickness of greater than 10 microns;

laminating the bottom surface of the transparent substrate to the backplane top surface includes:

interposing a transparent adhesive between the transparent substrate bottom surface and backplane top surface having a thickness of greater than 10 microns; and using a process selected from the group consisting of temperature, pressure, or both temperature and pressure.

* * * * *